(12) United States Patent
Ho et al.

(10) Patent No.: US 9,479,204 B2
(45) Date of Patent: Oct. 25, 2016

(54) SPECTRUM SENSING DETECTOR AND SPECTRUM SENSING DETECTION METHOD THEREOF

(71) Applicant: Institute For Information Industry, Taipei (TW)

(72) Inventors: Jan-Shin Ho, Magong (TW); Wei-Shing Wang, New Taipei (TW)

(73) Assignee: Institute For Information Industry, Taipei (TW)

( * ) Notice: Subject to any disclaimer, the term of this patent is extended or adjusted under 35 U.S.C. 154(b) by 0 days.

(21) Appl. No.: 14/622,912

(22) Filed: Feb. 15, 2015

(65) Prior Publication Data

US 2016/0226532 A1  Aug. 4, 2016

(30) Foreign Application Priority Data

Jan. 30, 2015 (TW) .............................. 104103120 A

(51) Int. Cl.
*H04B 17/00* (2015.01)
*H04B 1/04* (2006.01)

(52) U.S. Cl.
CPC ..... *H04B 1/0475* (2013.01); *H04B 2001/0408* (2013.01)

(58) Field of Classification Search
CPC ........... H04L 27/2662; H04L 27/2675; H04L 2025/03414; H04L 27/2657; H04L 1/20; H04L 2025/03426; H04L 25/0204; H04L 25/0212; H04L 25/022; H04L 25/0228; H04L 25/0256; H04L 25/03197; H04L 25/03292; H04L 27/2647; H04B 17/345; H04B 1/16; H04B 1/707; H04B 1/70735; H04B 3/235; H04B 3/32; H04B 3/493; H04B 7/024; H04B 7/0413; H04B 7/0452; H04B 7/0845; H04B 7/0848; H04B 7/0854; H04B 7/0874; H04W 12/02; H04W 12/12; H04W 16/14; H04W 88/02
See application file for complete search history.

(56) References Cited

U.S. PATENT DOCUMENTS

2006/0002485 A1* 1/2006 Moher .................. H04B 1/707
  375/260
2011/0090973 A1* 4/2011 Mishra .................. H04L 5/0025
  375/260

FOREIGN PATENT DOCUMENTS

| CN | 102664642 B | 3/2014 |
| TW | 201332305 A | 8/2013 |
| TW | 201410057 A | 3/2014 |

OTHER PUBLICATIONS

M.S. Oude Alink, A.B.J. Kokkeler, E.A.M. Klumperink, G.J.M. Smit, B. Nauta, Lowering the SNR Wall for Energy Detection Using Cross-Correlation. IEEE Transactions on Vehicular Technology, vol. 60, No. 8, Oct. 2011, 10 pages.
D.R. Joshi, D.C. Popescu, O.A. Dobre, Gradient-Based Threshold Adaptation for Energy Detector in Cognitive Radio Systems. IEEE Communications Letters, Vol. 15, No. 1, Jan. 2011, 3 pages.
Office Action to the corresponding Taiwan Patent Application rendered by the Taiwan Intellectual Property Office (TIPO) on Feb. 24, 2016, 5 pages.

* cited by examiner

*Primary Examiner* — Golam Sorowar
(74) *Attorney, Agent, or Firm* — Skaar Ulbrich Macari, P.A.

(57) ABSTRACT

A spectrum sensing detector and a spectrum sensing detection method thereof are provided. The spectrum sensing detector receives a radio signal, and generates a plurality of digital signals according to the radio signal. The spectrum sensing detector calculates a plurality of signal autocorrelation values and a plurality of signal cross-correlation values according to the digital signals, and calculates a signal variable value according to the signal autocorrelation values and the signal cross-correlation values. The spectrum sensing detector determines that the radio signal includes a user radio signal after deciding that the signal variable value is greater than a signal threshold value.

10 Claims, 8 Drawing Sheets

SPECTRUM SENSING DETECTOR AND SPECTRUM SENSING DETECTION METHOD THEREOF

PRIORITY

This application claims priority to Taiwan Patent Application No. 104103120 filed on Jan. 30, 2015, which is hereby incorporated by reference in its entirety.

FIELD

The present invention relates to a spectrum sensing detector and a spectrum sensing detection method thereof; and more particularly, the spectrum sensing detector and the spectrum sensing detection method thereof according to the present invention process a radio signal through a plurality of branches and calculate a plurality of signal autocorrelation values and a plurality of signal cross-correlation values correspondingly so that whether the radio signal comprises a user signal can be subsequently determined.

BACKGROUND

In the Cognitive Radio System (CRS), the spectrum sensing technologies are mainly used to sense a spectrum usage status in the network so as to subsequently determine a mode in which the spectrum is used. Specifically, a user equipment (UE) which is to communicate in the CRS must firstly confirm whether any other UE is communicating in the transmission frequency band so as to avoid interferences to the UE that is communicating in the transmission frequency band. In the prior art, this is confirmed mainly through an autocorrelation signal detector or a cross-correlation signal detector.

In detail, after receiving a radio signal in the transmission frequency band, the autocorrelation signal detector performs amplification, analog-to-digital (A/D) conversion, autocorrelation signal operation and sampling averaging on the radio signal directly through a single signal processing path, and compares the sampling average obtained with a signal threshold value. If the sampling average is greater than the signal threshold value, then it is determined that the radio signal comprises a signal of another UE; and otherwise, it is determined that the radio signal does not comprise a signal of any other UE.

On the other hand, after receiving a radio signal in the transmission frequency band, the cross-correlation signal detector performs amplification, A/D conversion, cross-correlation signal operation and sampling average on the radio signal through two signal processing paths, and similarly, compares the sampling average obtained with a signal threshold value. If the sampling average is greater than the signal threshold value, then it is determined that the radio signal comprises a signal of another UE; and otherwise, it is determined that the radio signal does not comprise a signal of any other UE.

However, the aforesaid autocorrelation detector technology uses only a single signal processing path, so noises produced during the signal processing has a direct influence on the subsequent determination result and greatly degrades the accuracy of the detector. On the other hand, although the cross-correlation detector that uses two processing paths can avoid the direct influence from the noises and slightly improve the accuracy of the detector, only a single signal cross-correlation value can be generated by the two signal processing paths and, therefore, improvement of the accuracy and the efficiency is relatively limited.

Accordingly, efforts have to be made in the art to provide a solution that can accurately determine the usage conditions of frequency bands and avoid interferences to communications of other users by significantly improving both the accuracy of the spectrum sensing detector and the usage efficiency of hardware.

SUMMARY

A primary objective of the present invention includes providing a spectrum sensing detector. The detector may include a receiving unit, a signal converting unit, a digital signal processing unit, a signal value processing unit and a signal variable processing unit. The receiving unit is configured to receive a radio signal. The signal converting unit is configured to convert the radio signal into a plurality of digital signals, which include at least three digital signals. The digital signal processing unit calculates a plurality of signal autocorrelation values of the digital signals, and calculates a plurality of signal cross-correlation values between each of the digital signals and different ones of the digital signals. The signal value processing unit calculates a signal variable value according to the signal autocorrelation values and the signal cross-correlation values. The signal variable processing unit decides that the radio signal comprises a user radio signal according to a determination result that the signal variable value is greater than a signal threshold value.

To achieve the aforesaid objective, certain embodiments of the present invention include a spectrum sensing detection method, which comprises: (a) enabling the spectrum sensing detector to receive a radio signal; (b) enabling the spectrum sensing detector to convert the radio signal into a plurality of digital signals; (c) enabling the spectrum sensing detector to calculate a plurality of signal autocorrelation values of the digital signals; (d) enabling the spectrum sensing detector to calculate a plurality of signal cross-correlation values between each of the digital signals and different ones of the digital signals; (e) enabling the spectrum sensing detector to calculate a signal variable value according to the signal autocorrelation values and the signal cross-correlation values; (f) enabling the spectrum sensing detector to determine that the signal variable value is greater than a signal threshold value; and (g) enabling the spectrum sensing detector to determine that the radio signal comprises a user radio signal according to the result of the step (f).

The detailed technology and preferred embodiments implemented for the subject invention are described in the following paragraphs accompanying the appended drawings for people skilled in this field to well appreciate the features of the claimed invention.

DETAILED DESCRIPTION

In the following description, the invention will be explained with reference to example embodiments thereof. However, these example embodiments are not intended to limit the present invention to any specific example, embodiment, environment, applications or particular implementations described in these embodiments. Therefore, description of these example embodiments is only for purpose of illustration rather than to limit the present invention, and the scope of the present invention shall be governed by the claims.

In the following embodiments and the attached drawings, elements unrelated to the present invention are omitted from depiction; and dimensional relationships among individual elements in the attached drawings are illustrated only for ease of understanding, but not to limit the actual scale.

Figure 1:
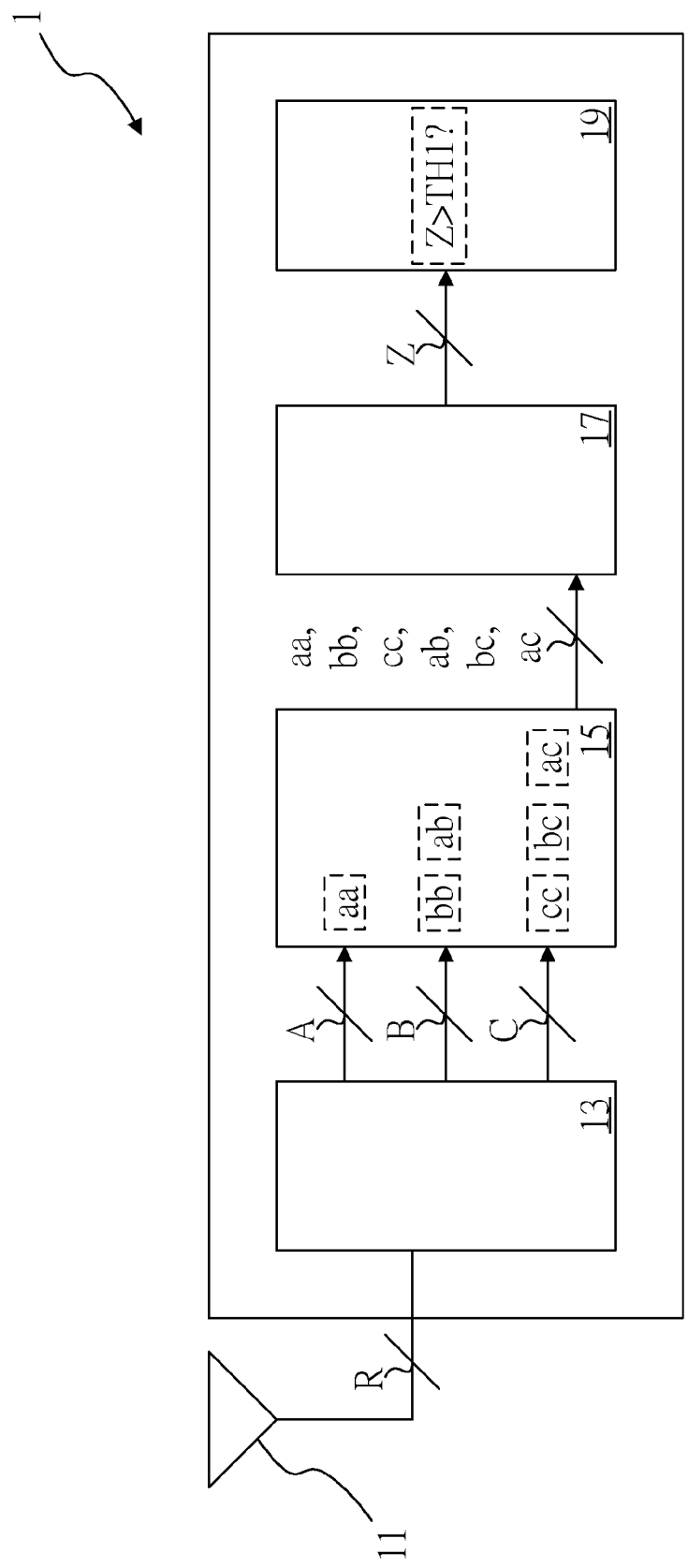
FIG. 1 is a schematic view of a spectrum sensing detector according to a first embodiment of the present invention.

Referring to FIG. 1, there is shown a schematic view of a spectrum sensing detector 1 according to a first embodiment of the present invention. The spectrum sensing detector 1 comprises a receiving unit 11, a signal converting unit 13, a digital signal processing unit 15, a signal value processing unit 17 and a signal variable processing unit 19. Interactions among the individual elements will be further described hereinafter.

Firstly, the receiving unit 11 receives a radio signal R from a radio system environment. Then, the signal converting unit 13 converts the radio signal R into a plurality of digital signals A, B and C, and transmits the digital signals A, B and C to the digital signal processing unit 15 so that the digital signal processing unit 15 calculates signal autocorrelation values and signal cross-correlation values of the digital signals A, B and C.

Specifically, the digital signal processing unit 15 calculates the respective signal autocorrelation values aa, bb and cc of the digital signals A, B and C. The signal autocorrelation value aa is the autocorrelation value of the digital signal A, the signal autocorrelation value bb is the autocorrelation value of the digital signal B, and the signal autocorrelation value cc is the autocorrelation value of the digital signal C.

On the other hand, the digital signal processing unit 15 calculates the signal cross-correlation values ab, ac and bc between each of the digital signals A, B and C and different ones of the digital signals. The signal cross-correlation value ab represents the cross-correlation value between the digital signals A and B, the signal cross-correlation value ac represents the cross-correlation value between the digital signals A and C, and the signal cross-correlation value bc represents the cross-correlation value between the digital signals B and C.

Next, the signal value processing unit 17 calculates a signal variable value Z according to the signal autocorrelation values aa, bb and cc and the signal cross-correlation values ab, ac and bc. Finally, the signal variable processing unit 19 determines whether the signal variable value Z is greater than a signal threshold value TH1. If the signal variable value Z is greater than the signal threshold value TH1, then it is determined that the radio signal R comprises a user radio signal (not depicted); and otherwise, it is determined that the radio signal R does not comprise any other user radio signal.

It should be particularly appreciated that, as can be understood by people skilled in the art, the autocorrelation values and the cross-correlation values of the digital signals in the first embodiment may be of different forms (e.g., in a scalar, vector or matrix or the like) depending on different signal sampling modes and network environments. However, because the present invention mainly focuses on the way of generating the values and the processing procedure of the values, the way of calculating the correlation values will not be further detailed herein.

Furthermore, the signal variable value Z may be calculated as a real part of a sum of the autocorrelation values and the cross-correlation values, or as an average of the real part of the sum of the autocorrelation values and the cross-correlation values; and the signal threshold value TH1 may be adjusted in magnitude correspondingly according to the calculating ways of the signal variable value Z. However, this is not intended to limit the technologies of the present invention, and other implementations of calculating the signal variable value and adjusting the signal threshold value may be readily devised by people skilled in the art according to the previous disclosures.

It should be additionally emphasized that, for ease of understanding the technologies of the present invention, the signal converting unit 13 in the first embodiment converts the radio signal R into three digital signals A, B and C; however, this is not intended to limit the greatest number of the digital signals, and conversion into and usage of more than three digital signals will be easily understood by people skilled in the art according to the above technical disclosures.

Figure 2:
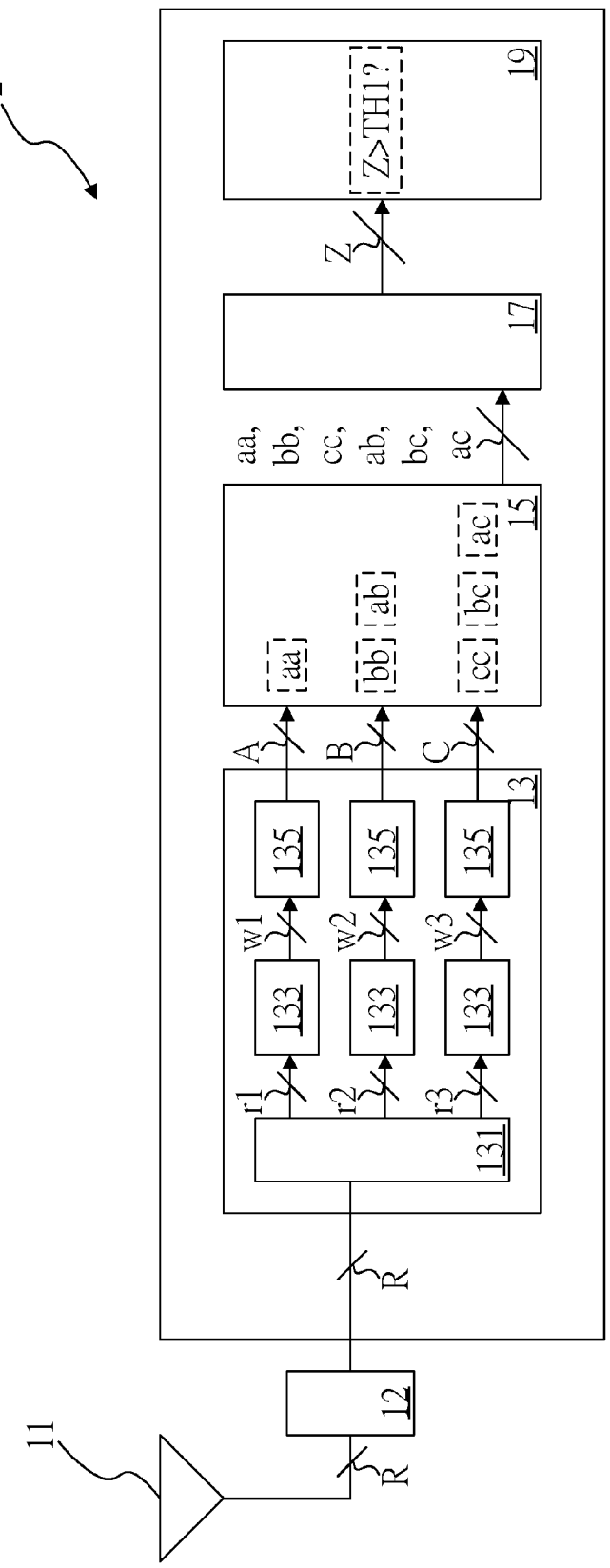
FIG. 2 is a schematic view of a spectrum sensing detector according to a second embodiment of the present invention.

Referring to FIG. 2, there is shown a schematic view of a spectrum sensing detector 2 according to a second embodiment of the present invention. The architecture of the second embodiment is similar to that of the first embodiment, so the elements bearing the same reference numerals also have the same functions and, thus, will not be further described herein. However, the second embodiment differs from the first embodiment in that, the spectrum sensing detector 2 of the second embodiment further comprises a power amplifying element 12 and the signal converting unit 13 further comprises a power dividing element 131, a plurality of filtering elements 133 and a plurality of analog-to-digital (A/D) converting elements 135. Interactions among the individual elements will be further described hereinafter.

In detail, the power amplifying element 12 is mainly configured to amplify the power of the radio signal R to facilitate subsequent related operations. Additionally, after the radio signal R whose power has been amplified is received by the signal converting unit 13, the power dividing element 131 is mainly configured to divide the single radio signal R into a plurality of radio sub-signals. Likewise, in the second embodiment, the power dividing element 131 is mainly configured to divide the single radio signal R into three radio sub-signals r1, r2 and r3.

Then, the filtering elements 133 are respectively configured to filter a plurality of necessary frequency band signals w1, w2 and w3 from the radio sub-signals r1, r2 and r3. Afterwards, the A/D converting elements 135 respectively convert the frequency band signals w1, w2 and w3 into the digital signals A, B and C for purpose of subsequently calculating the correlation values and making a determination on the radio signal.

Figure 3:
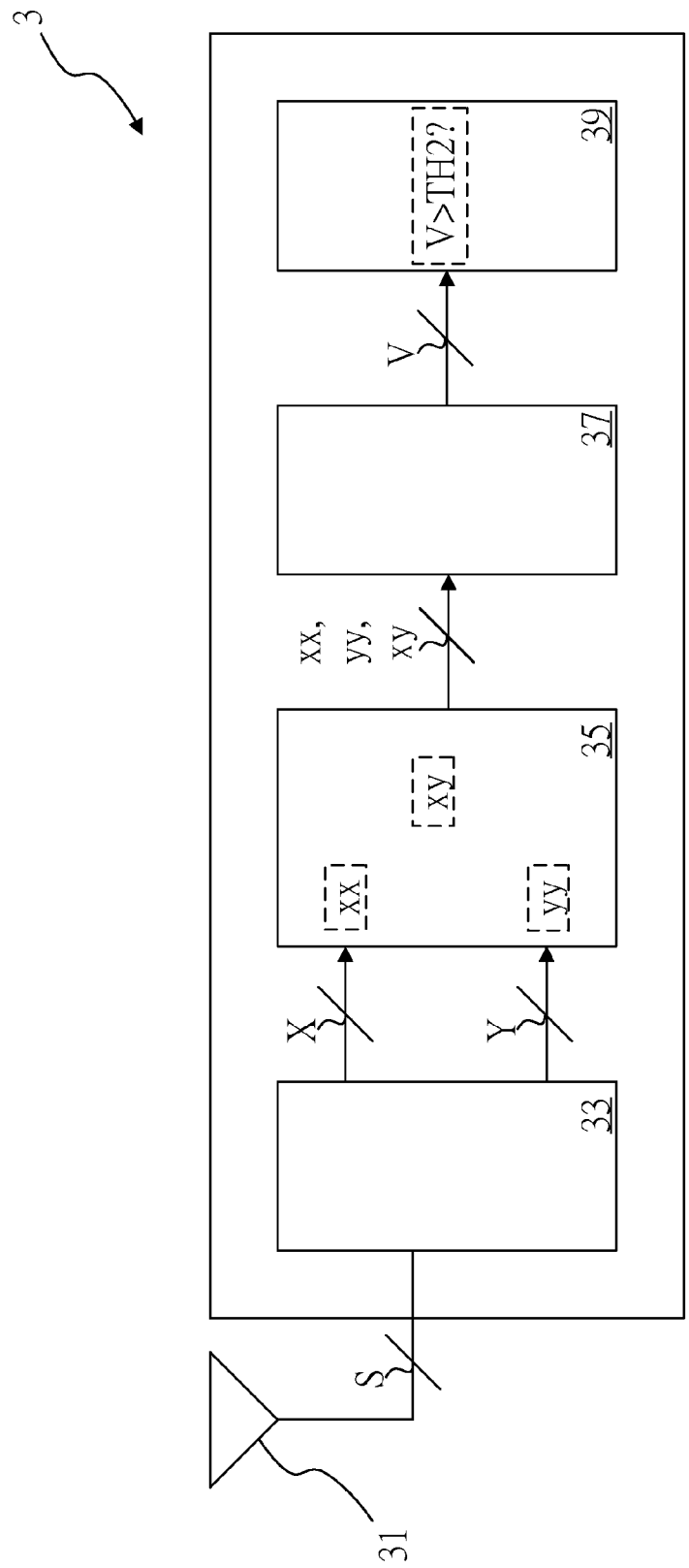
FIG. 3 is a schematic view of a spectrum sensing detector according to a third embodiment of the present invention.

Referring to FIG. 3, there is shown a schematic view of a spectrum sensing detector 3 according to a third embodiment of the present invention. The spectrum sensing detector 3 comprises a receiving unit 31, a signal converting unit 33, a digital signal processing unit 35, a signal value processing unit 37 and a signal variable processing unit 39. Interactions of the individual elements will be further described hereinafter.

Firstly, the receiving unit 31 receives a radio signal S from a radio system environment. Then, the signal converting unit 33 converts the radio signal S into a first digital signal X and a second digital signal Y, and transmits the first digital signal X and the second digital signal Y to the digital signal processing unit 35 so that the digital signal processing unit 35 calculates signal autocorrelation values and a signal cross-correlation value of the first digital signal X and the second digital signal Y.

In detail, the digital signal processing unit 35 calculates a first signal autocorrelation value xx and a second signal autocorrelation value yy for the first digital signal X and the second digital signal Y respectively. On the other hand, the digital signal processing unit 35 calculates a signal cross-correlation value xy for the first digital signal X and the second digital signal Y.

Then, the signal value processing unit 37 calculates a signal variable value V according to the first signal autocorrelation value xx, the second signal autocorrelation value yy and the signal cross-correlation value xy. Finally, the signal variable processing unit 39 determines whether the signal variable value V is greater than a signal threshold value TH2. If the signal variable value V is greater than the signal threshold value TH2, then it is determined that the radio signal S comprises a user radio signal (not depicted); and otherwise, it is determined that the radio signal S does not comprise any other user radio signal.

Figure 4:
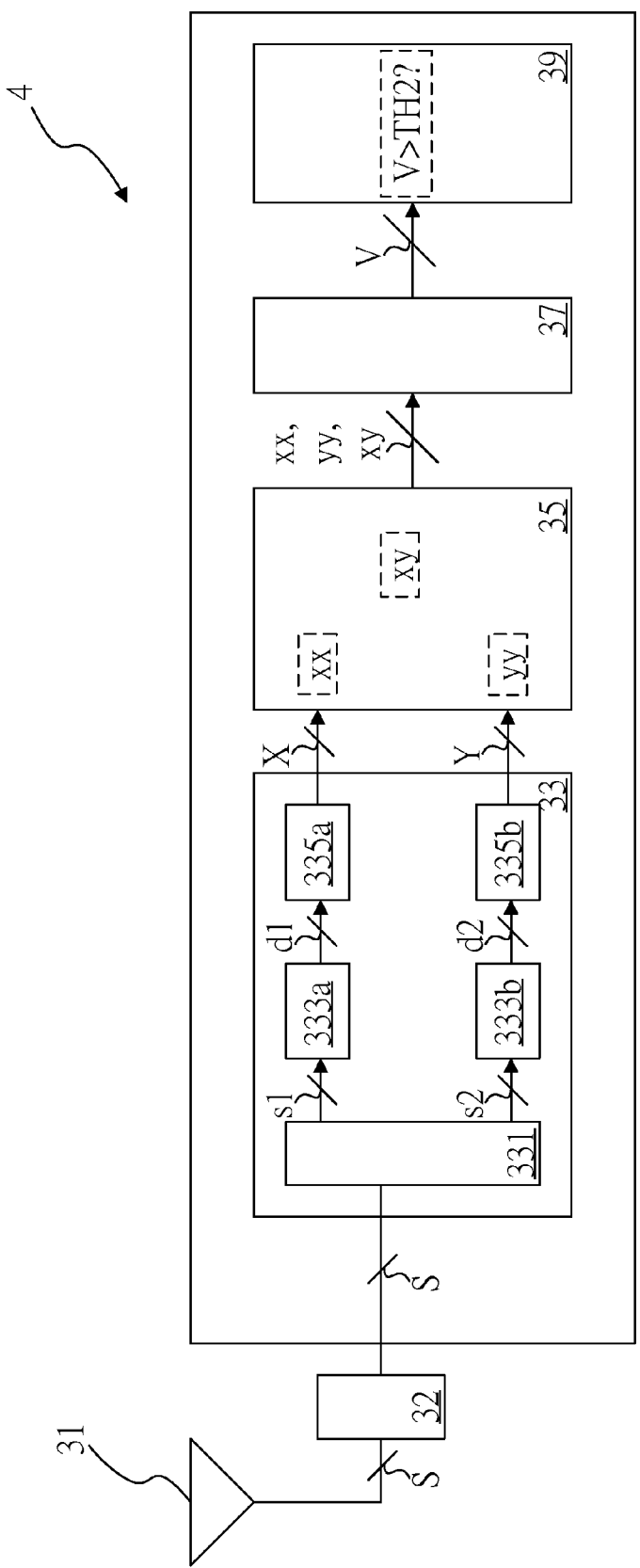
FIG. 4 is a schematic view of a spectrum sensing detector according to a fourth embodiment of the present invention.

Referring to FIG. 4, there is shown a schematic view of a spectrum sensing detector 4 according to a fourth embodiment of the present invention. The architecture of the fourth embodiment is similar to that of the third embodiment, so the elements bearing the same reference numerals also have the same functions and, thus, will not be further described herein. However, the fourth embodiment differs from the third embodiment in that, the spectrum sensing detector 4 of the fourth embodiment further comprises a power amplifying element 32 and the signal converting unit 33 further comprises a power dividing element 331, a first filtering element 333a, a second filtering element 333b, a first A/D converting element 335a and a second A/D converting element 335b. Interactions among the individual elements will be further described hereinafter.

In detail, the power amplifying element 32 is mainly configured to amplify the power of the radio signal S to facilitate the subsequent related operations. Additionally, after the radio signal S whose power has been amplified is received by the signal converting unit 33, the power dividing element 331 is mainly configured to divide the single radio signal S into a first radio sub-signal s1 and a second radio sub-signal s2.

Then, the first filtering element 333a and the second filtering element 333b are respectively configured to filter a first frequency band signal d1 and a second frequency band signal d2 that are desired from the first radio sub-signal s1 and the second radio sub-signal s2. Afterwards, the first A/D converting element 335a and the second A/D converting element 335b may convert the first frequency band signal d1 and the second frequency band signal d2 into the first digital signal X and the second digital signal Y respectively for purpose of subsequently calculating the correlation values and making a determination on the radio signal.

Figure 5:
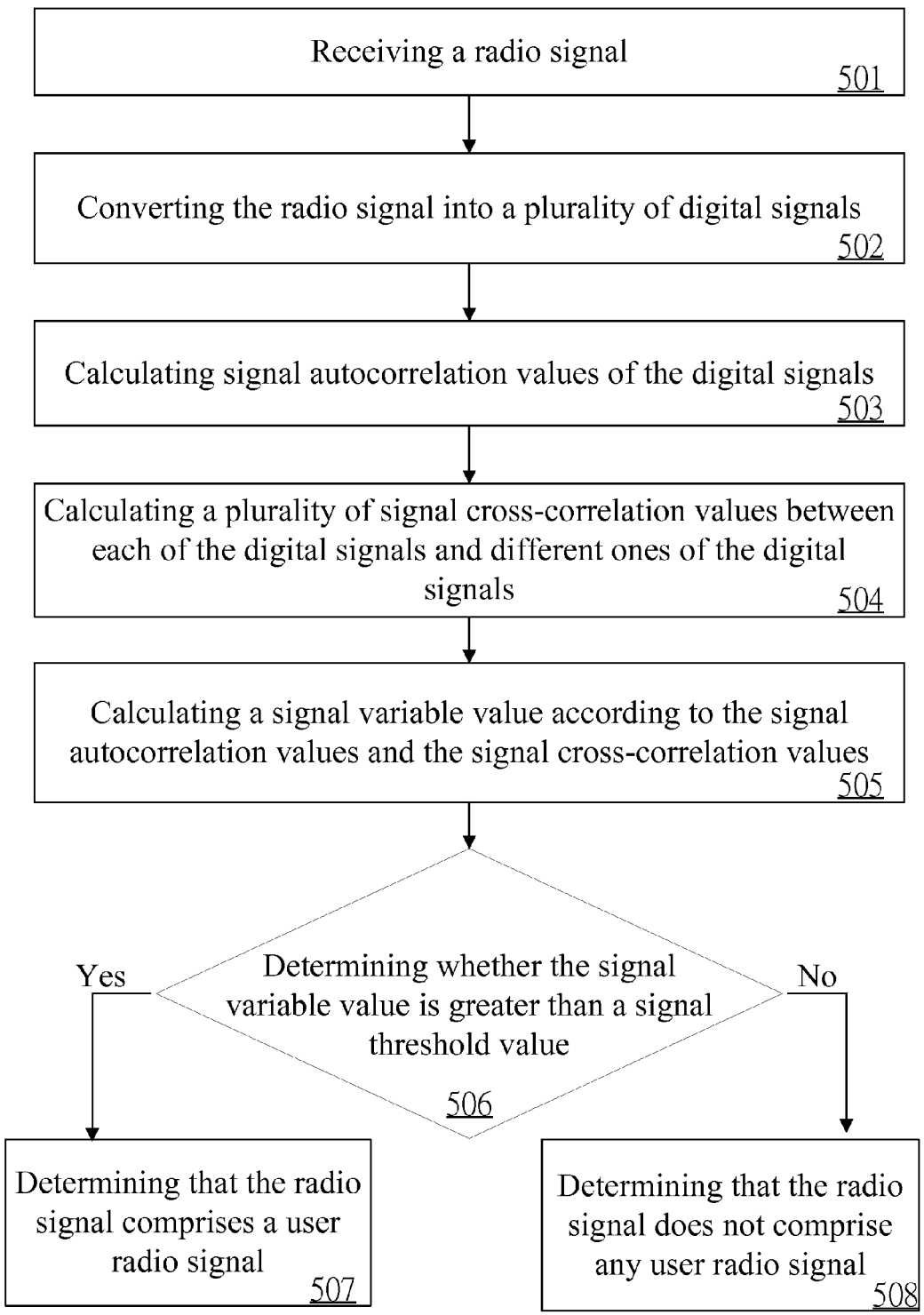
FIG. 5 is a flowchart diagram of a spectrum sensing detection method according to a fifth embodiment of the present invention.

A fifth embodiment of the present invention is a spectrum sensing detection method, a flowchart diagram of which is shown in FIG. 5. The method of the fifth embodiment is used for a spectrum sensing detector (e.g., the spectrum sensing detector 1 of the previous embodiment). Detailed steps of the fifth embodiment are described as follows.

Firstly, step 501 is executed to enable the spectrum sensing detector to receive a radio signal. Step 502 is executed to enable the spectrum sensing detector to convert the radio signal into a plurality of digital signals. Similarly in the fifth embodiment, the digital signals include at least three digital signals. Step 503 is executed to enable the spectrum sensing detector to calculate signal autocorrelation values of the digital signals. Step 504 is executed to enable the spectrum sensing detector to calculate a plurality of signal cross-correlation values between each of the digital signals and different ones of the digital signals.

Then, step 505 is executed to enable the spectrum sensing detector to calculate a signal variable value according to the signal autocorrelation values and the signal cross-correlation values. Step 506 is executed to enable the spectrum sensing detector to determine whether the signal variable value is greater than a signal threshold value. If the determination result is "yes", then step 507 is executed to enable the spectrum sensing detector to determine that the radio signal comprises a user radio signal; and otherwise, step 508 is executed to enable the spectrum sensing detector to determine that the radio signal does not comprise any user radio signal.

Figure 6:
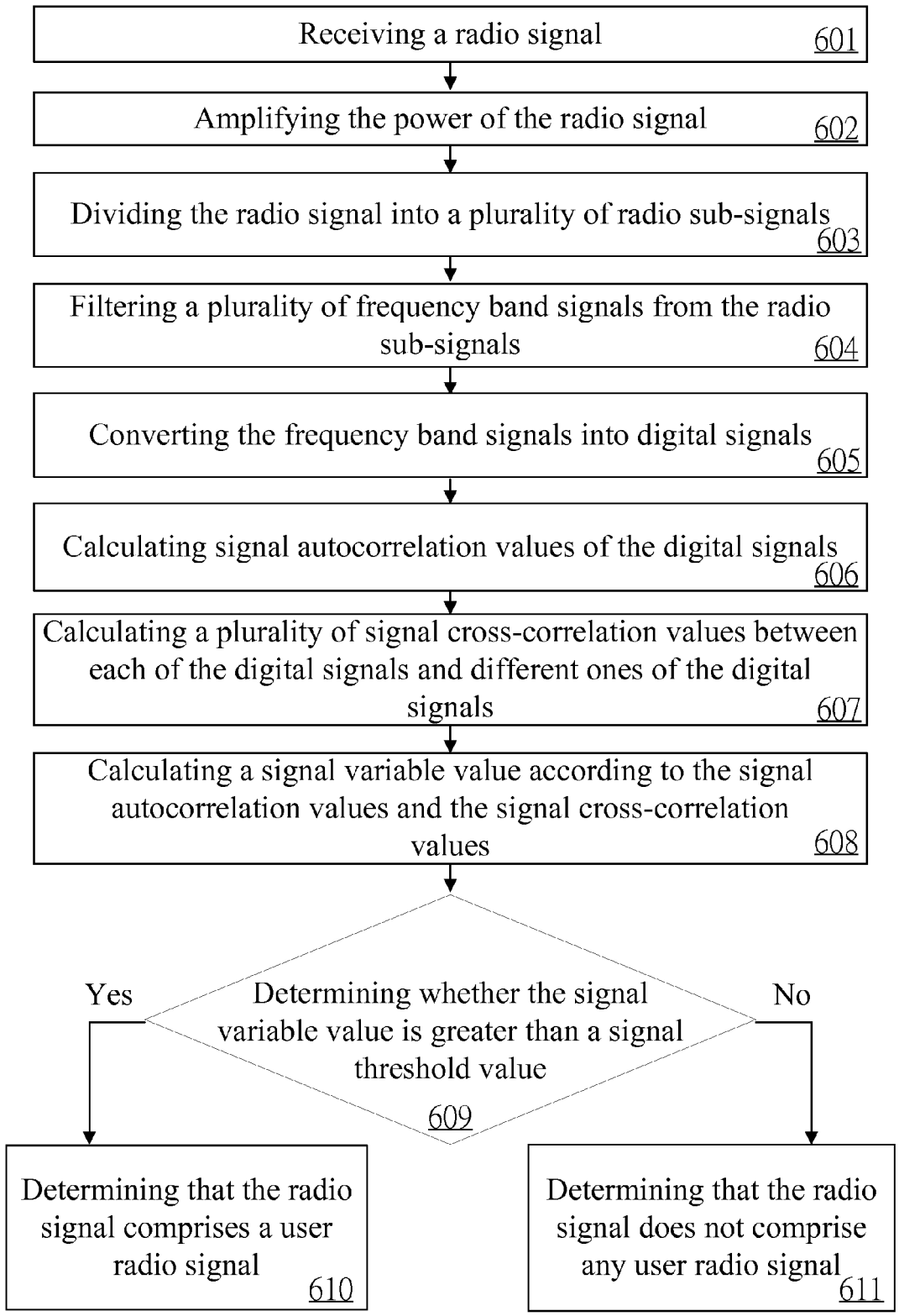
FIG. 6 is a flowchart diagram of a spectrum sensing detection method according to a sixth embodiment of the present invention.

A sixth embodiment of the present invention is a spectrum sensing detection method, a flowchart diagram of which is shown in FIG. 6. The method of the sixth embodiment is used for a spectrum sensing detector (e.g., the spectrum sensing detector 2 of the previous embodiment). Detailed steps of the sixth embodiment are described as follows.

Firstly, step 601 is executed to enable the spectrum sensing detector to receive a radio signal. Step 602 is executed to enable the spectrum sensing detector to amplify the power of the radio signal. Step 603 is executed to enable the spectrum sensing detector to divide the radio signal into a plurality of radio sub-signals. Step 604 is executed to enable the spectrum sensing detector to filter a plurality of frequency band signals from the radio sub-signals. Step 605 is executed to enable the spectrum sensing detector to convert the frequency band signals into digital signals.

Similarly in the sixth embodiment, the digital signals include at least three digital signals. Then, step 606 is executed to enable the spectrum sensing detector to calculate signal autocorrelation values of the digital signals. Step 607 is executed to enable the spectrum sensing detector to calculate a plurality of signal cross-correlation values between each of the digital signals and different ones of the digital signals.

Then, step 608 is executed to enable the spectrum sensing detector to calculate a signal variable value according to the signal autocorrelation values and the signal cross-correlation values. Step 609 is executed to enable the spectrum sensing detector to determine whether the signal variable value is greater than a signal threshold value. If the determination result is "yes", then step 610 is executed to enable the spectrum sensing detector to determine that the radio signal comprises a user radio signal; and otherwise, step 611 is executed to enable the spectrum sensing detector to determine that the radio signal does not comprise any user radio signal.

Figure 7:
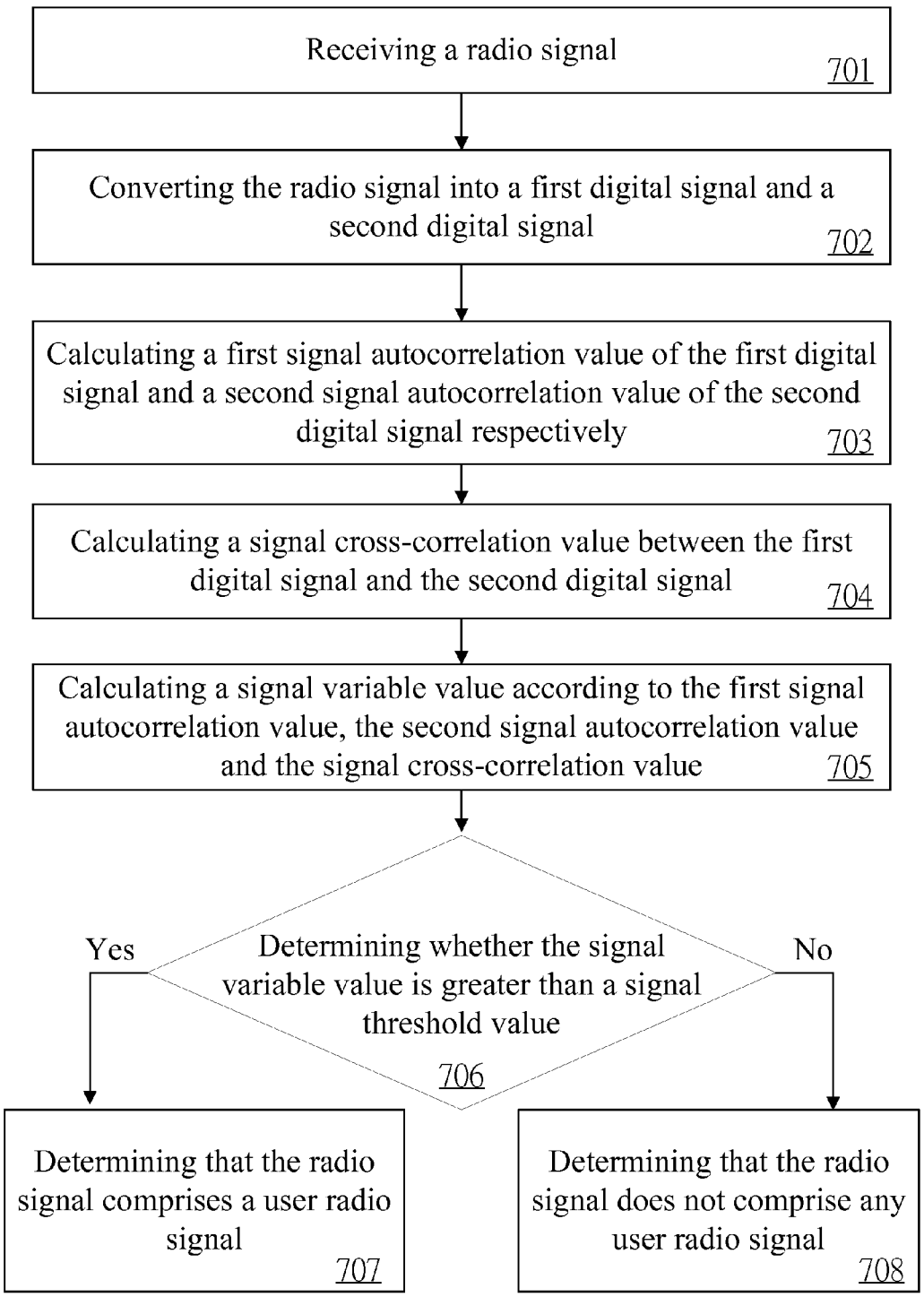
FIG. 7 is a flowchart diagram of a spectrum sensing detection method according to a seventh embodiment of the present invention.

A seventh embodiment of the present invention is a spectrum sensing detection method, a flowchart diagram of which is shown in FIG. 7. The method of the seventh embodiment is used for a spectrum sensing detector (e.g., the spectrum sensing detector 3 of the previous embodiment). Detailed steps of the seventh embodiment are described as follows.

Firstly, step 701 is executed to enable the spectrum sensing detector to receive a radio signal. Step 702 is executed to enable the spectrum sensing detector to convert the radio signal into a first digital signal and a second digital signal. Step 703 is executed to enable the spectrum sensing detector to calculate a first signal autocorrelation value of the first digital signal and a second signal autocorrelation value of the second digital signal respectively. Step 704 is executed to enable the spectrum sensing detector to calculate a signal cross-correlation value between the first digital signal and the second digital signal.

Next, step 705 is executed to enable the spectrum sensing detector to calculate a signal variable value according to the first signal autocorrelation value, the second signal autocorrelation value and the signal cross-correlation value. Step 706 is executed to enable the spectrum sensing detector to determine whether the signal variable value is greater than a signal threshold value. If the determining result is "yes", then step 707 is executed to enable the spectrum sensing detector to determine that the radio signal comprises a user radio signal; and otherwise, step 708 is executed to enable the spectrum sensing detector to determine that the radio signal does not comprise any user radio signal.

Figure 8:
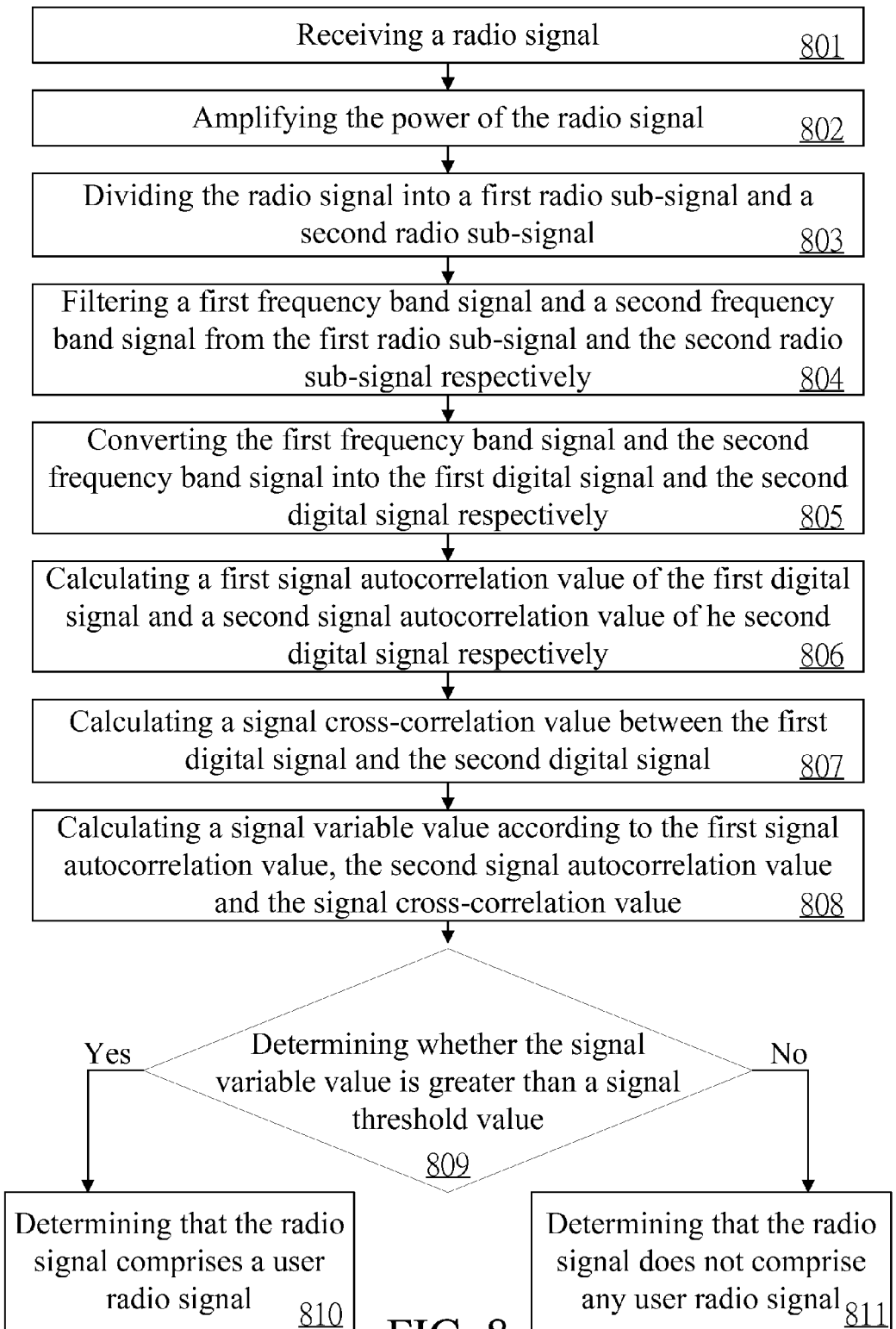
FIG. 8 is a flowchart diagram of a spectrum sensing detection method according to an eighth embodiment of the present invention.

An eighth embodiment of the present invention is a spectrum sensing detection method, a flowchart diagram of which is shown in FIG. 8. The method of the eighth embodiment is used for a spectrum sensing detector (e.g., the spectrum sensing detector 4 of the previous embodiment). Detailed steps of the eighth embodiment are described as follows.

Firstly, step 801 is executed to enable the spectrum sensing detector to receive a radio signal. Step 802 is executed to enable the spectrum sensing detector to amplify the power of the radio signal. Step 803 is executed to enable the spectrum sensing detector to divide the radio signal into a first radio sub-signal and a second radio sub-signal. Step 804 is executed to enable the spectrum sensing detector to filter a first frequency band signal and a second frequency band signal from the first radio sub-signal and the second radio sub-signal respectively.

Then, step 805 is executed to enable the spectrum sensing detector to convert the first frequency band signal and the second frequency band signal into a first digital signal and a second digital signal respectively. Step 806 is executed to enable the spectrum sensing detector to calculate a first signal autocorrelation value of the first digital signal and a second signal autocorrelation value of the second digital signal respectively. Step 807 is executed to enable the spectrum sensing detector to calculate a signal cross-correlation value between the first digital signal and the second digital signal.

Then, step 808 is executed to enable the spectrum sensing detector to calculate a signal variable value according to the first signal autocorrelation value, the second signal autocorrelation value and the signal cross-correlation value. Step 809 is executed to enable the spectrum sensing detector to determine whether the signal variable value is greater than a signal threshold value. If the determining result is "yes", then step 810 is executed to enable the spectrum sensing detector to determine that the radio signal comprises a user radio signal; and otherwise, step 811 is executed to enable the spectrum sensing detector to determine that the radio signal does not comprise any user radio signal.

According to the above descriptions, the spectrum sensing detector and the spectrum sensing detection method thereof according to the present invention process and digitalize a radio signal through a plurality of branches, calculate signal autocorrelation values of the digital signals and signal cross-correlation values between each of the digital signals and different ones of the digital signals, and then calculate a signal variable value accordingly to facilitate the determination of whether the radio signal comprises a user radio signal. In this way, through the use of both the autocorrelation values and cross-correlation values of the digital signals, the accuracy of the spectrum sensing detector can be improved and the usage efficiency of the hardware architecture is increased at the same time.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A spectrum sensing detector, comprising:
    a receiving unit, being configured to receive a radio signal;
    a signal converting unit, comprising:
        a power dividing element, being configured to divide the radio signal into a plurality of radio sub-signals;
        a plurality of filtering elements, being configured to filter a plurality of frequency band signals from the radio sub-signals; and
        a plurality of analog-to-digital (A/D) converting elements, being configured to convert the frequency band signals into a plurality of digital signals, wherein the digital signals include at least three digital signals;
    a digital signal processing unit, being configured to:
        calculate a plurality of signal autocorrelation values of the digital signals;
        calculate a plurality of signal cross-correlation values between each of the digital signals and different ones of the digital signals;
    a signal value processing unit, being configured to calculate a signal variable value according to the signal autocorrelation values and the signal cross-correlation values; and
    a signal variable processing unit, being configured to:
        determine that the signal variable value is greater than a signal threshold value; and
        determine that the radio signal comprises a user radio signal according to the result that the signal variable value is greater than the signal threshold value.

2. The spectrum sensing detector of claim 1, further comprising:
    a power amplifying element, being configured to amplify the power of the radio signal.

3. The spectrum sensing detector of claim 1, wherein the signal variable value is a real part of a sum of the signal autocorrelation values and the signal cross-correlation values.

4. A spectrum sensing detection method for a spectrum sensing detector, the method comprising:
(a) the spectrum sensing detector receiving a radio signal;
(b1) the spectrum sensing detector dividing the radio signal into a plurality of radio sub-signals;
(b2) the spectrum sensing detector filtering a plurality of frequency band signals from the radio sub-signals;
(b3) the spectrum sensing detector converting the frequency band signals into a plurality of digital signals, wherein the digital signals include at least three digital signals;
(c) the spectrum sensing detector calculating a plurality of signal autocorrelation values of the digital signals;
(d) the spectrum sensing detector calculating a plurality of signal cross-correlation values between each of the digital signals and different ones of the digital signals;
(e) the spectrum sensing detector calculating a signal variable value according to the signal autocorrelation values and the signal cross-correlation values;
(f) the spectrum sensing detector determining that the signal variable value is greater than a signal threshold value; and
(g) the spectrum sensing detector determining that the radio signal comprises a user radio signal according to the result of the step (f).

5. The spectrum sensing detection method of claim 4, further comprising the following after the step (a):
(a1) the spectrum sensing detector amplifying the power of the radio signal.

6. The spectrum detection method of claim 4, wherein the signal variable value is a real part of a sum of the signal autocorrelation values and the signal cross-correlation values.

7. A spectrum sensing detector, comprising:
a receiving unit, being configured to receive a radio signal;
a signal converting unit, comprising:
a power dividing element, being configured to divide the radio signal into a first radio sub-signal and a second radio sub-signal;
a first filtering element, being configured to filter a first frequency band signal from the first radio sub-signal;
a first A/D converting element, being configured to convert the first frequency band signal into a first digital signal;
a second filtering element, being configured to filter a second frequency band signal from the second radio sub-signal; and
a second A/D converting element, being configured to convert the second frequency band signal into a second digital signal;
a digital signal processing unit, being configured to:
calculate a first signal autocorrelation value and a second signal autocorrelation value of the first digital signal and the second digital signal respectively; and
calculate a signal cross-correlation value between the first digital signal and the second digital signal;
a signal value processing unit, being configured to calculate a signal variable value according to the first signal autocorrelation value, the second signal autocorrelation value and the signal cross-correlation value; and
a signal variable processing unit, being configured to:
determine that the signal variable value is greater than a signal threshold value; and
determine that the radio signal comprises a user radio signal according to the result that the signal variable value is greater than the signal threshold value.

8. The spectrum sensing detector of claim 7, further comprising:
a power amplifying element, being configured to amplify the power of the radio signal.

9. A spectrum sensing detection method for a spectrum sensing detector, the method comprising:
(a) the spectrum sensing detector receiving a radio signal;
(b1) the spectrum sensing detector dividing the radio signal into a first radio sub-signal and a second radio sub-signal;
(b2) the spectrum sensing detector filtering a first frequency band signal and a second frequency band signal from the first radio sub-signal and the second radio sub-signal respectively;
(b3) the spectrum sensing detector converting the first frequency band signal and the second frequency band signal into a first digital signal and a second digital signal respectively;
(c) the spectrum sensing detector calculating a first signal autocorrelation value and a second signal autocorrelation value of the first digital signal and the second digital signal respectively;
(d) the spectrum sensing detector calculating a signal cross-correlation value between the first digital signal and the second digital signal;
(e) the spectrum sensing detector calculating a signal variable value according to the first signal autocorrelation value, the second signal autocorrelation value and the signal cross-correlation value;
(f) the spectrum sensing detector determining that the signal variable value is greater than a signal threshold value; and
(g) the spectrum sensing detector determining that the radio signal comprises a user radio signal according to the result of the step (f).

10. The spectrum sensing detection method of claim 9, further comprising the following after the step (a):
(a1) the spectrum sensing detector amplifying the power of the radio signal.

* * * * *